US012745597B2

(12) United States Patent
Kubota et al.

(10) Patent No.: US 12,745,597 B2
(45) Date of Patent: Sep. 22, 2026

(54) SUBSTRATE STORING CONTAINER AND LID-BODY-SIDE SUBSTRATE SUPPORT PART

(71) Applicant: MIRAIAL CO., LTD., Tokyo (JP)

(72) Inventors: Kouji Kubota, Tokyo (JP); Kouichi Nishizaka, Tokyo (JP)

(73) Assignee: MIRAIAL CO., LTD., Tokyo (JP)

( * ) Notice: Subject to any disclaimer, the term of this patent is extended or adjusted under 35 U.S.C. 154(b) by 0 days.

(21) Appl. No.: 18/870,597

(22) PCT Filed: May 31, 2022

(86) PCT No.: PCT/JP2022/022223

§ 371 (c)(1),
(2) Date: Nov. 29, 2024

(87) PCT Pub. No.: WO2023/233554

PCT Pub. Date: Dec. 7, 2023

(65) Prior Publication Data

US 2026/0026299 A1 Jan. 22, 2026

(51) Int. Cl.
*H10P 72/10* (2026.01)
*H10P 72/76* (2026.01)

(52) U.S. Cl.
CPC .......... *H10P 72/1921* (2026.01); *H10P 72/14* (2026.01); *H10P 72/1922* (2026.01); *H10P 72/7614* (2026.01); *H10P 72/7624* (2026.01)

(58) Field of Classification Search
CPC . H01L 21/67383; H01L 21/37; H01L 21/373; B65D 85/48
USPC ................................ 206/710, 711, 712, 723
See application file for complete search history.

(56) References Cited

U.S. PATENT DOCUMENTS 4,874,654 A * 10/1989 Funaki .................. B29C 45/561 428/338
5,584,401 A * 12/1996 Yoshida ............ H01L 21/67343 118/500
6,951,284 B2 * 10/2005 Cheesman ........ H01L 21/67369 211/41.18
7,344,031 B2 * 3/2008 Hasegawa ......... H01L 21/67369 257/E21.001

(Continued)

FOREIGN PATENT DOCUMENTS

CN 110021542 A 7/2019
JP H01-129836 U 9/1989

(Continued)

OTHER PUBLICATIONS

Office Action of KR Application No. 10-2024-7037674 and English translation, dated Dec. 4, 2025, 14 pages.

*Primary Examiner* — Ernesto A Grano
(74) *Attorney, Agent, or Firm* — MUNCY, GEISSLER, OLDS & LOWE, P.C.

(57) ABSTRACT

A substrate storing container includes a lid body side substrate support portion. The lid body side substrate support portion has support flat surfaces respectively configured to contact with peripheral surfaces of the edge portions of the plurality of substrates so as to support the substrates, and the support flat surfaces that contact with the peripheral surfaces of the edge portions of adjacent ones of the plurality of substrates have overlap portions adjacent to each other in a direction parallel to upper surfaces of the substrates.

8 Claims, 7 Drawing Sheets

(56) References Cited

U.S. PATENT DOCUMENTS 7,523,830 B2 * 4/2009 Burns .............. H01L 21/67369 206/711
8,118,169 B2 * 2/2012 Hosoi .............. H01L 21/67369 206/711
8,528,738 B2 * 9/2013 Wiseman .......... H01L 21/67369 206/711
11,587,810 B2 * 2/2023 Harr .................. H01L 21/67369
12,080,577 B2 * 9/2024 Kubota ............ H01L 21/67383
12,431,375 B2 * 9/2025 Chiu ................ H01L 21/67396
2003/0047476 A1 3/2003 Wu et al.
2003/0221985 A1 * 12/2003 Yajima ............. H01L 21/67369 206/711
2005/0247594 A1 * 11/2005 Mimura ............ H01L 21/67393 206/710
2005/0274645 A1 * 12/2005 Hasegawa ......... H01L 21/67383 257/E21.001
2006/0213796 A1 * 9/2006 Kominami ........ H01L 21/67373 206/711
2010/0025287 A1 * 2/2010 Lin .................. H01L 21/67369 206/711
2013/0056389 A1 * 3/2013 Gregerson ........ H01L 21/67386 53/473
2013/0319907 A1 * 12/2013 Gregerson ........ H01L 21/67376 206/711
2014/0197068 A1 * 7/2014 Cho .................. H01L 21/67383 206/711
2015/0279711 A1 * 10/2015 Matsutori ......... H01L 21/67383 206/723
2015/0294882 A1 * 10/2015 Matsutori ......... H01L 21/67383 206/723
2017/0025294 A1 * 1/2017 Ozawa .............. H01L 21/67369
2018/0068882 A1 * 3/2018 Kato ................. H01L 21/67373
2018/0182655 A1 * 6/2018 Yokoyama ........ H01L 21/67383
2020/0051841 A1 2/2020 Sato

FOREIGN PATENT DOCUMENTS

JP H07-307379 A 11/1995
JP 2005-508814 A 4/2005
JP 2007-153414 A 6/2007
JP 6258069 B2 9/2015
JP 2016-018961 A 2/2016
JP 6375577 B2 8/2018
WO WO2003/042071 A1 5/2003
WO WO2018/185894 A1 10/2018

* cited by examiner 1
2
20
22
23
236
231A
231B
21
28
25
5
26
24
241A
241B
27
W
3
4
32A
32A
32B
32B
33
33
UP
D1
D11
D12
D2
D21
D22
D3
D31
D32

3
7
34
4
D21
D2
D31
D1
D11
D12
D22
D32
D3

SUBSTRATE STORING CONTAINER AND LID-BODY-SIDE SUBSTRATE SUPPORT PART

TECHNICAL FIELD

The present invention relates to a substrate storing container and a lid body side substrate support portion for use in, for example, storing, keeping, conveying, and transporting substrates composed of a semiconductor wafer or the like.

BACKGROUND ART

A known substrate storing container for storing substrates composed of a semiconductor wafer and conveying the substrates in a process in a factory includes a container main body and a lid body (for example, see Patent Documents 1 and 2).

One end portion of the container main body has an opening peripheral portion that defines a container main body opening portion. The other end portion of the container main body has a closed cylindrical wall portion. The container main body has a substrate storing space formed therein. The substrate storing space is surrounded and defined by the wall portion, and is capable of storing the substrates. The lid body is detachably attachable to the opening peripheral portion, and is capable of closing the container main body opening portion. Lateral substrate support portions are provided adjacent to the wall portion so as to form counterparts to each other in the substrate storing space. When the container main body opening portion is not closed by the lid body, the lateral substrate support portions can support edge portions of the substrates such that the adjacent substrates are arranged in parallel and spaced apart from each other by a predetermined interval.

A front retainer is provided on a part of the lid body that faces the substrate storing space when the container main body opening portion is closed by the lid body. The front retainer can support edge portions of the substrates when the container main body opening is closed by the lid body. Furthermore, a back side substrate support portion is provided adjacent to the wall portion so as to form a counterpart to the front retainer. The back side substrate support portion can support edge portions of the substrates. When the container main body opening portion is closed by the lid body, the back side substrate support portion cooperates with the front retainer to support the substrates such that the adjacent substrates are arranged in parallel and spaced apart from each other by a predetermined interval.

CITATION LIST

Patent Document

Patent Document 1: Japanese Patent No. 6375577
Patent Document 2: Japanese Patent No. 6258069

DISCLOSURE OF THE INVENTION

Problems to be Solved by the Invention

In a semiconductor manufacturing process, substrates thinned by polishing or the like may be stored in a substrate storing container and conveyed. In this case, the substrate may experience bending due to, for example, its own weight or vibration, a slight impact, etc. during the conveyance, and the bending may lead to breakage or damage. For this reason, for example a configuration is conceivable in which support bodies for supporting a plurality of substrates are arranged at large pitches in the substrate storing container so that the substrates are conveyed while avoiding such breakage and damage. However, there is a case in which the above-mentioned bending causes cross-slotting or the like in a state in which the container main body opening portion is closed by the lid body, whereby the substrates cannot be supported by cooperation between the support bodies and the front retainer.

An object of the present invention is to provide a substrate storing container and a lid body side substrate support portion that can hold a thin substrate without breakage of or damage to the substrate in a case where the thin substrate is bent due to its own weight or an impact.

Means for Solving the Problems

The present invention relates to a substrate storing container including: a container main body including a tubular wall portion that has one end at which a container main body opening portion is formed and an other end closed, the container main body having a substrate storing space defined by an inner surface of the tubular wall portion, the substrate storing space being capable of storing a plurality of substrates and communicating with the container main body opening portion; a lid body detachably attachable to the container main body opening portion and capable of closing the container main body opening portion; a lid body side substrate support portion disposed on a part of the lid body, the part facing the substrate storing space when the container main body opening portion is closed by the lid body, the lid body side substrate support portion being capable of supporting edge portions of the plurality of substrates when the container main body opening portion is closed by the lid body; and a back side substrate support portion disposed to form a counterpart to the lid body side substrate support portion in the substrate storing space and capable of supporting the edge portion of the plurality of substrates, the back side substrate support portion being configured to cooperate with the lid body side substrate support portion to support the plurality of substrates such that the edge portions of the plurality of substrates are arranged in parallel when the container main body opening portion is closed by the lid body. The lid body side substrate support portion has support flat surfaces respectively configured to contact with peripheral surfaces of the edge portions of the plurality of substrates so as to support the substrates, and the support flat surfaces that contact with the peripheral surfaces of the edge portions of adjacent ones of the plurality of substrates have overlap portions adjacent to each other in a direction parallel to upper surfaces of the substrates.

Preferably, a plurality of the support flat surfaces are provided to correspond to the peripheral surfaces of the edge portions of the plurality of substrates on a one-to-one basis. Preferably, each support flat surface is located at a free end of a cantilever spring. Preferably, each support flat surface contacts with one substrate of the plurality of substrates at one point on a peripheral surface of the edge portion of a front part of the one substrate. Preferably, the substrate storing space stores the plurality of substrates arranged in parallel, and each support flat surface has a length of 5 mm or greater in a direction in which the plurality of substrates are arranged in parallel. Preferably, each support flat surface has an area of 50 $mm^2$ or greater.

The present invention relates to a lid body side substrate support portion for a substrate storing container that includes: a container main body including a tubular wall portion that has one end at which a container main body opening portion is formed and an other end closed, the container main body having a substrate storing space defined by an inner surface of the tubular wall portion, the substrate storing space being capable of storing a plurality of substrates and communicating with the container main body opening portion; a lid body detachably attachable to the container main body opening portion and capable of closing the container main body opening portion; a lid body side substrate support portion disposed on a part of the lid body, the part facing the substrate storing space when the container main body opening portion is closed by the lid body, the lid body side substrate support portion being capable of supporting edge portions of the plurality of substrates when the container main body opening portion is closed by the lid body; and a back side substrate support portion disposed to form a counterpart to the lid body side substrate support portion in the substrate storing space and capable of supporting the edge portion of the plurality of substrates, the back side substrate support portion being configured to cooperate with the lid body side substrate support portion to support the plurality of substrates such that the edge portions of the plurality of substrates are arranged in parallel when the container main body opening portion is closed by the lid body. The lid body side substrate support portion includes: support flat surfaces configured to respectively contact with peripheral surfaces of the edge portions of the plurality of substrates so as to support the substrates; and the support flat surfaces that contact with the peripheral surfaces of the edge portions of adjacent ones of the plurality of substrates have overlap portions adjacent to each other in a direction parallel to upper surfaces of the substrates.

Preferably, a plurality of the support flat surfaces are provided to correspond to the peripheral surfaces of the edge portions of the plurality of substrates on a one-to-one basis. Preferably, each support flat surface is located at a free end of a cantilever spring. Preferably, each support flat surface contacts with one substrate of the plurality of substrates at one point on a peripheral surface of the edge portion of a front part of the one substrate. Preferably, the substrate storing space stores the plurality of substrates arranged in parallel, and each support flat surface has a length of 5 mm or greater in a direction in which the plurality of substrates are arranged in parallel. Preferably, each support flat surface has an area of 50 $mm^2$ or greater.

Effects of the Invention

The present invention can provide a substrate storing container and a lid body side substrate support portion that can hold a thin substrate without breakage of or damage to the substrate in a case where the thin substrate is bent due to its own weight or an impact.

PREFERRED MODE FOR CARRYING OUT THE INVENTION

Figure 1:
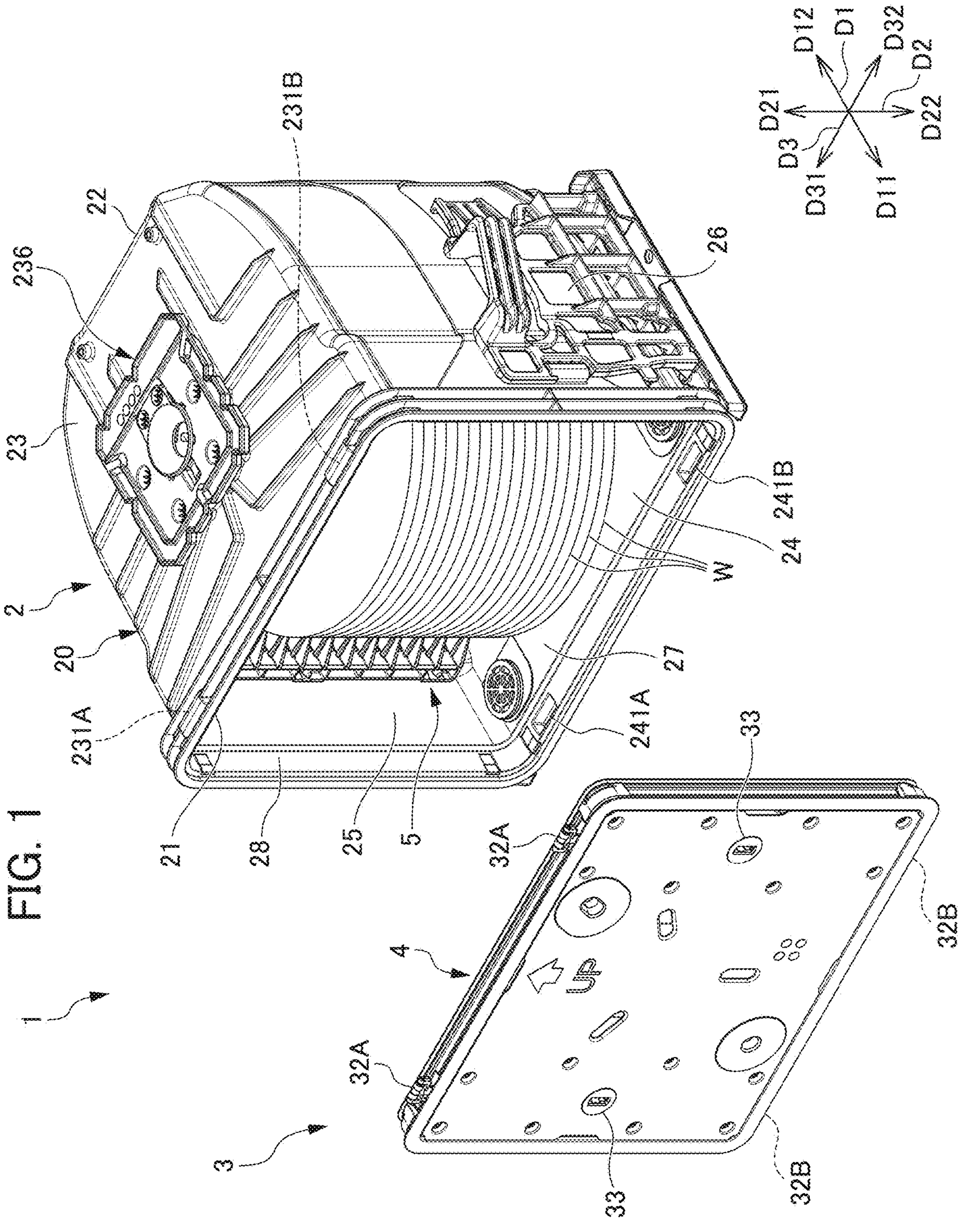
FIG. 1 is an exploded perspective view illustrating a state in which a plurality of substrates are stored in a substrate storing container according to an embodiment of the present invention.

A substrate storing container 1 and lid body side substrate support portions 73 according to an embodiment will be described below with reference to the drawings. Hereinafter, for the purpose of illustration, a direction from a container main body 2 toward a lid body 3 (described later) (i.e., a direction from the upper right toward the lower left in FIG. 1) is defined as a forward direction D11 and a direction opposite thereto is defined as a backward direction D12. Furthermore, these directions are collectively defined as a forward/backward direction D1. A direction from a lower wall 24 to an upper wall 23 (described later) (an upward direction in FIG. 1) is defined as an upward direction D21 and a direction opposite thereto is defined as a downward direction D22. Furthermore, these directions are collectively defined as an upward/downward direction D2. A direction from a second side wall 26 to a first side wall 25 (described later) (direction from the lower right to the upper left in FIG. 1) is defined as a left direction D31 and a direction opposite thereto is defined as a right direction D32. Furthermore, these directions are collectively defined as a left/right direction D3. Main figures show arrows indicating the foregoing directions.

Each of substrates W (see FIG. 1) stored in the substrate storing container 1 is a substrate for industrial use that is thinned by polishing or the like, and examples of the substrate W include a disk-shaped silicon wafer, a disk-shaped glass wafer, and a disk-shaped sapphire wafer. Each substrate W of the present embodiment is a silicon wafer having a diameter of 300 mm.

Figure 2:
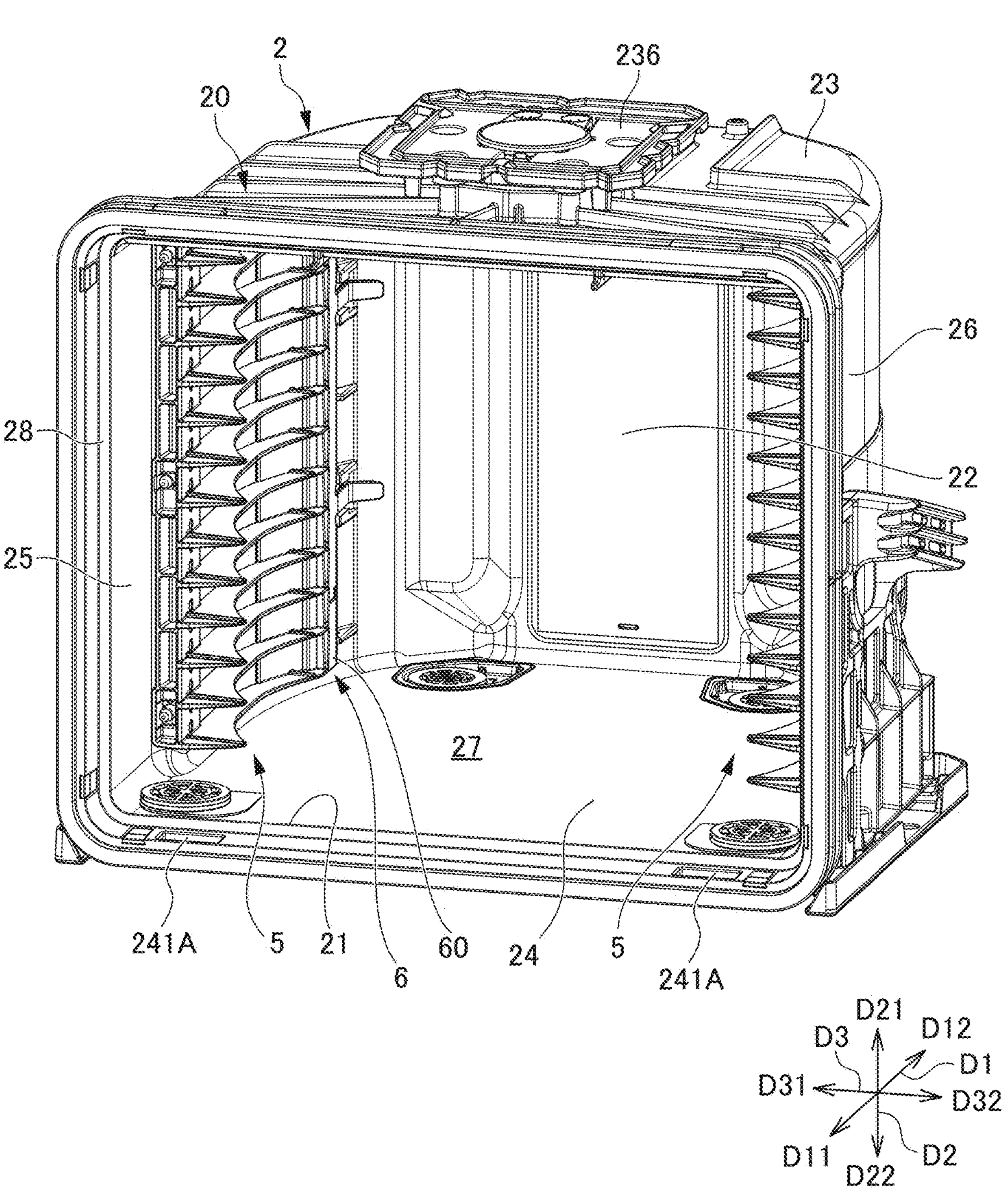
FIG. 2 is a perspective view illustrating a container main body of the substrate storing container according to the embodiment of the present invention.

As illustrated in FIGS. 1 and 2, the substrate storing container 1 is used as an in-process container for storing and conveying the above-described substrates W composed of a silicon wafer in a process in a factory, or is used as a shipping container for transporting the substrates W by transportation means such as land transport, air transport, and sea transport. The substrate storing container 1 includes a container main body 2 and a lid body 3. The container main body 2 includes substrate support plate-like portions 5 serving as lateral substrate support portions, and back side substrate support portions 6. The lid body 3 includes a front retainer 7 (see FIGS. 4 to 6) having the lid body side substrate support portions 73.

As illustrated in FIG. 1, etc., the container main body 2 includes a tubular wall portion 20 that has one end at which a container main body opening portion 21 is formed and the other end closed. The container main body 2 has a substrate storing space 27 formed therein. The substrate storing space 27 is surrounded and defined by the wall portion 20. As illustrated in FIG. 2, the substrate support plate-like portions 5 are disposed adjacent to portions of the wall portion 20 that define the substrate storing space 27. As illustrated in FIG. 1, the substrate storing space 27 can store therein the plurality of substrates W.

The substrate support plate-like portions 5 are provided adjacent to the wall portion 20 so as to form counterparts to each other in the substrate storing space 27. When the container main body opening portion 21 is not closed by the lid body 3 (in a lid open state), the substrate support plate-like portions 5 can support edge portions of the plurality of substrates W by contacting with the edge portions of the plurality of substrates W such that the adjacent substrates W are arranged in parallel and spaced apart from each other by a predetermined interval. The back side substrate support portions 6 are provided rearward of the substrate support plate-like portions 5.

The back side substrate support portions 6 (see FIG. 2, etc.) are provided adjacent to the wall portion 20 such that the back side substrate support portions 6 form a counterpart to the front retainer 7 (described later; see FIG. 3, etc.) in the substrate storing space 27. When the container main body opening portion 21 is closed by the lid body 3 (in a lid closed state), the back side substrate support portions 6 can support rear parts of the edge portions of the plurality of substrates W by contacting with the edge portions of the plurality of substrates W.

The lid body 3 is detachably attachable to an opening peripheral portion 28 (see FIG. 1, etc.) that defines the container main body opening portion 21, and can close the container main body opening portion 21. The front retainer 7 is provided on a portion of the lid body 3 that faces the substrate storing space 27 when the container main body opening portion 21 is closed by the lid body 3. The front retainer 7 is disposed so as to form a counterpart to the back side substrate support portions 6 in the substrate storing space 27.

When the container main body opening portion 21 is closed by the lid body 3, the front retainer 7 can support front parts of the edge portions of the plurality of substrates W by contacting with the edge portions of the plurality of substrates W. When the container main body opening portion 21 is closed by the lid body 3, the front retainer 7 cooperates with the back side substrate support portions 6 to hold the plurality of substrates W such that the adjacent substrates W are arranged in parallel and spaced apart from each other by a predetermined interval.

The substrate storing container 1 is made of a resin such as a plastic material, and examples of the resin include thermoplastic resins such as polycarbonate, cycloolefin polymer, polyetherimide, polyetherketone, polybutylene terephthalate, polyetheretherketone, and liquid crystal polymer, and alloys thereof. A conductive substance, such as carbon fibers, carbon powder, carbon nanotubes, a conductive polymer, and the like, is selectively added to the foregoing resins as a molding material in a case where conductivity is to be imparted. It is also possible to add glass fibers, carbon fibers, or the like to increase the rigidity.

In the following, each of the components will be described in detail. As illustrated in FIG. 1, the wall portion 20 of the container main body 2 includes a back wall 22, an upper wall 23, a lower wall 24, a first side wall 25, and a second side wall 26. The back wall 22, the upper wall 23, the lower wall 24, the first side wall 25, and the second side wall 26 are made of one or more of the above-described materials, and are formed into one piece.

The first side wall 25 is opposite to the second side wall 26, and the upper wall 23 is opposite to the lower wall 24. The rear edge of the upper wall 23, the rear edge of the lower wall 24, the rear edge of the first side wall 25, and the rear edge of the second side wall 26 are all connected to the back wall 22. The front edge of the upper wall 23, the front edge of the lower wall 24, the front edge of the first side wall 25, and the front edge of the second side wall 26 have a positional relationship of being opposite to the back wall 22 and constitute the opening peripheral portion 28 that defines the container main body opening portion 21 having a substantially rectangular shape.

The opening peripheral portion 28 is provided at one end of the container main body 2, and the back wall 22 is located at the other end of the container main body 2. The outer surface of the wall portion 20 forms the outer shape of the container main body 2, which is a box shape. The inner surface of the wall portion 20, that is, the inner surface of the back wall 22, the inner surface of the upper wall 23, the inner surface of the lower wall 24, the inner surface of the first side wall 25, and the inner surface of the second side wall 26 surround and define the substrate storing space 27. The container main body opening portion 21 defined by the opening peripheral portion 28 communicates with the substrate storing space 27 surrounded by the wall portion 20 and formed in the container main body 2. The substrate storing space 27 can store a maximum of thirteen substrates W. It should be noted that although the substrate storing structure according to the present embodiment is capable of storing thirteen substrates W, the substrate support plate-like portions 5 may be removed and substrate support plate-like portions (not shown) capable of storing twenty-five substrates W may be fixed to the container main body 2 to form a substrate storing container structure capable of storing twenty-five substrates W.

As illustrated in FIG. 1, latch engagement concave portions 231A, 231B, 241A, and 241B, which are concave outward with respect to the substrate storing space 27, are formed in portions of the upper wall 23 and the lower wall 24 near the opening peripheral portion 28. A total of four latch engagement concave portions 231A, 231B, 241A, and 241B are formed in proximity to the left and right ends of the upper wall 23 and the left and right ends the lower wall 24, on a one-to-one basis.

As illustrated in FIG. 1, a top flange 236 is fixed to a central portion of the upper wall 23. The top flange 236 is a member by means of which the substrate storing container 1 is hooked and hung in an AMHS (Automated Material Handling System), a PGV (Person Guided Vehicle), etc.

The substrate support plate-like portions 5 are respectively provided adjacent to the first side wall 25 and the second side wall 26, and are arranged so as to form counterparts to each other in the left/right direction D3 in the substrate storing space 27. The substrate support plate-like portions 5 may be formed integrally with the first side wall 25 and the second side wall 26.

Each substrate support plate-like portion 5 has a plate-like substantially arc shape. A total of twenty-six substrate support plate-like portions 5 are provided so that each of the first side wall 25 and the second side wall 26 has thirteen substrate support plate-like portions 5 arranged adjacent thereto in the upward/downward direction D2. Adjacent ones of the substrate support plate-like portions 5 are arranged in a positional relationship in which they are in parallel with each other and spaced apart from each other by an interval of 10 mm to 30 mm in the upward/downward direction D2. Another plate-like member is disposed above the uppermost substrate support plate-like portion 5 in parallel with the substrate support plate-like portions 5. This member serves as a guide for guiding the uppermost substrate W when the uppermost substrate W is inserted into the substrate storing space 27.

The thirteen substrate support plate-like portions 5 disposed adjacent to the first side wall 25 have a positional relationship of being opposite to the thirteen substrate support plate-like portions 5 disposed adjacent to the second side wall 26 in the left/right direction D3. The thirteen substrate support plate-like portions 5 and the member serving as a plate-like guide parallel to the substrate support plate-like portions 5 have a positional relationship of being parallel to the inner surface of the lower wall 24. As illustrated in FIG. 2, etc., each substrate support plate-like portion 5 has a protrusion on its upper surface. Each substrate W supported by the substrate support plate-like portion 5 contacts with only the protruding end of the protrusion, and is not in plane contact with the substrate support plate-like portion 5.

The substrate support plate-like portions 5 are capable of supporting edge portions of the plurality of substrates W in a positional relationship in which adjacent ones of the plurality of substrates W are spaced apart from each other by a predetermined interval and in parallel with each other.

As illustrated in FIG. 2, the back side substrate support portions 6 each include back side edge end support portions 60. The back side edge end support portions 60 are formed integrally with rear ends of the substrate support plate-like portions 5. The back side substrate support portions 6 may be formed integrally with the first side wall 25, the second side wall 26, or the back wall 22.

The back side edge end support portions 60 are provided so as to correspond to the substrates W that can be stored in the substrate storing space 27 on a one-to-one basis: specifically, thirteen back side edge end support portions 60 are provided. The back side edge end support portions 60 disposed adjacent to the first side wall 25 and the back side edge end support portions 60 disposed adjacent to the second side wall 26 each have a positional relationship of forming a counterpart to the front retainer 7, which will be described later, in the forward/backward direction D1. When the substrates W are stored in the substrate storing space 27 and the lid body 3 is closed, the back side edge end support portions 60 sandwich and support ends of the edge portions of the substrates W.

Next, the lid body 3 and the front retainer 7 will be described in detail. As illustrated in FIG. 1, etc., the lid body 3 has a substantially rectangular shape that substantially matches the shape of the opening peripheral portion 28 of the container main body 2. The lid body 3 is detachably attachable to the opening peripheral portion 28 of the container main body 2, and the lid body 3 can close the container main body opening portion 21 by being attached to the opening peripheral portion 28. The lid body 3 has an annular sealing member 4 attached to an inner surface thereof (the surface on the rear side of the lid body 3 in FIG. 1). Examples of a material forming the sealing member 4 include various thermoplastic elastomers such as polyester-based elastically deformable elastomers and polyolefin-based elastically deformable elastomers, fluorine rubber, silicon rubber, etc. The sealing member 4 annularly extends along the entire outer peripheral edge of the lid body 3.

In a state where the lid body 3 is attached to the opening peripheral portion 28, the sealing member 4 is elastically deformed by being sandwiched between the opening peripheral portion 28 and the inner surface of the lid body 3, whereby the lid body 3 hermitically closes the container main body opening portion 21. By detaching the lid body 3 from the opening peripheral portion 28, the substrates W can be placed into and removed from the substrate storing space 27 in the container main body 2.

The lid body 3 has a lid body main body that forms the outer shape of the lid body 3 and that is provided with a latch mechanism. As illustrated in FIG. 1, the latch mechanism is provided in proximity to the left and right ends of the lid body main body, and include two upper latch parts 32A that can protrude from the upper side of the lid body main body in the upward direction D21, and two lower latch parts 32B that can protrude from the lower side of the lid body main body in the downward direction D22. The two upper latch parts 32A are respectively disposed in proximity to the left and right ends of the upper side of the lid body main body, and the two lower latch parts 32B are respectively disposed in proximity to the left and right ends of the lower side of the lid body main body.

On the outer surface of the lid body main body, operation parts 33 are provided. Operating the operation parts 33 from the front side of the lid body main body causes the upper latch parts 32A and the lower latch parts 32B to protrude from the upper side and the lower side of the lid body main body and to retract not to protrude from the upper side and the lower side of the lid body main body. The upper latch parts 32A protrude from the upper side of the lid body main body in the upward direction D21 to engage with the latch engagement concave portions 231A, 231B of the container main body 2, and the lower latch parts 32B protrude from the lower side of the lid body main body in the downward direction D22 to engage with the latch engagement concave portions 241A, 241B of the container main body 2, whereby the lid body 3 is fastened to the opening peripheral portion 28 of the container main body 2.

Figure 3:
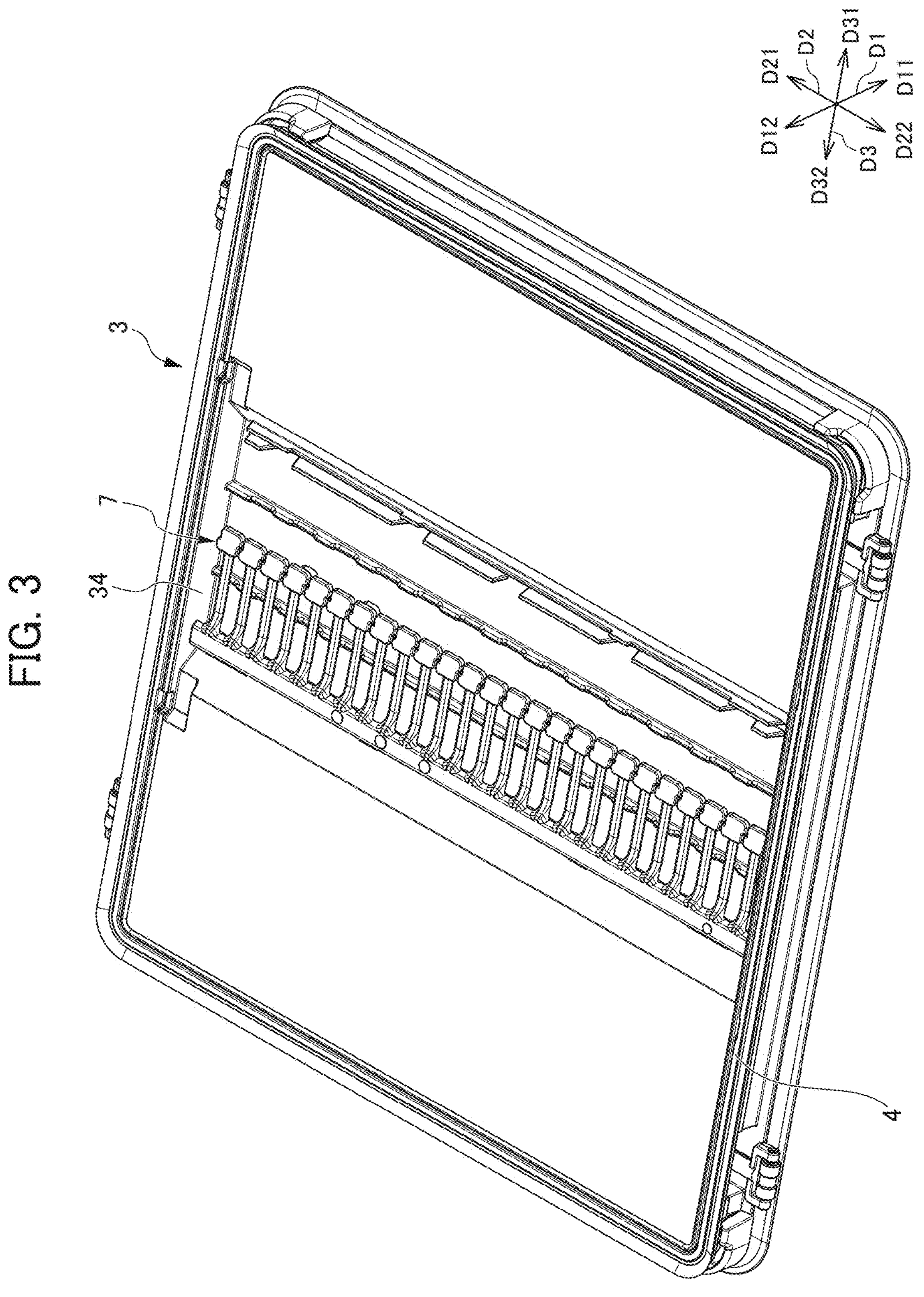
FIG. 3 is a perspective view illustrating a lid body of the substrate storing container according to the embodiment of the present invention.

As illustrated in FIG. 3, on the inner side of the lid body main body constituting the lid body 3, a recess 34 is formed which is concave outward with respect to the substrate storing space 27 (concave in the forward direction D11). The front retainer 7 is fixed to a part of the lid body main body inside the recess 34.

Figure 4:
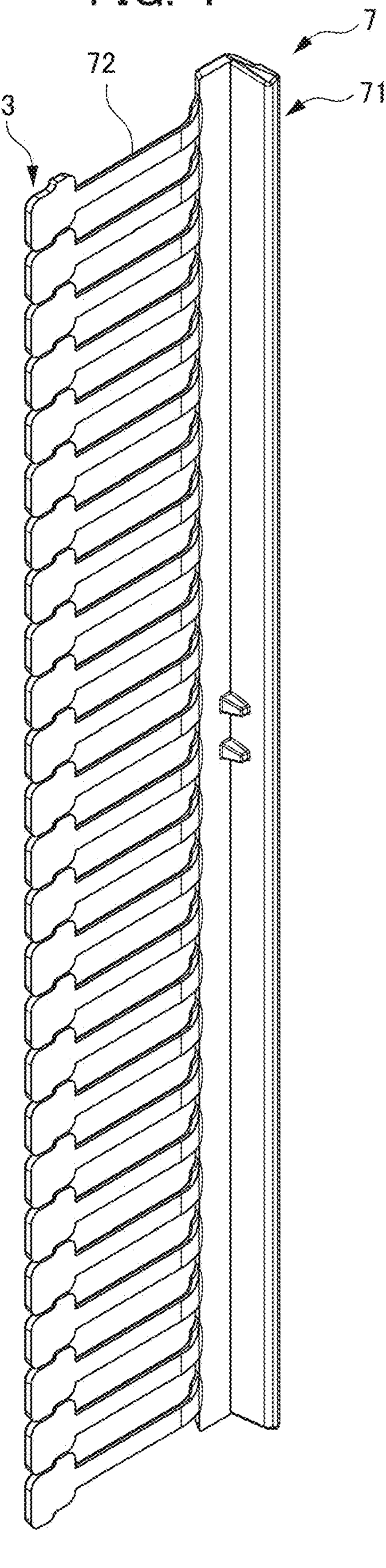
FIG. 4 is a perspective view illustrating a front retainer of the substrate storing container according to the embodiment of the present invention.
Figure 5:
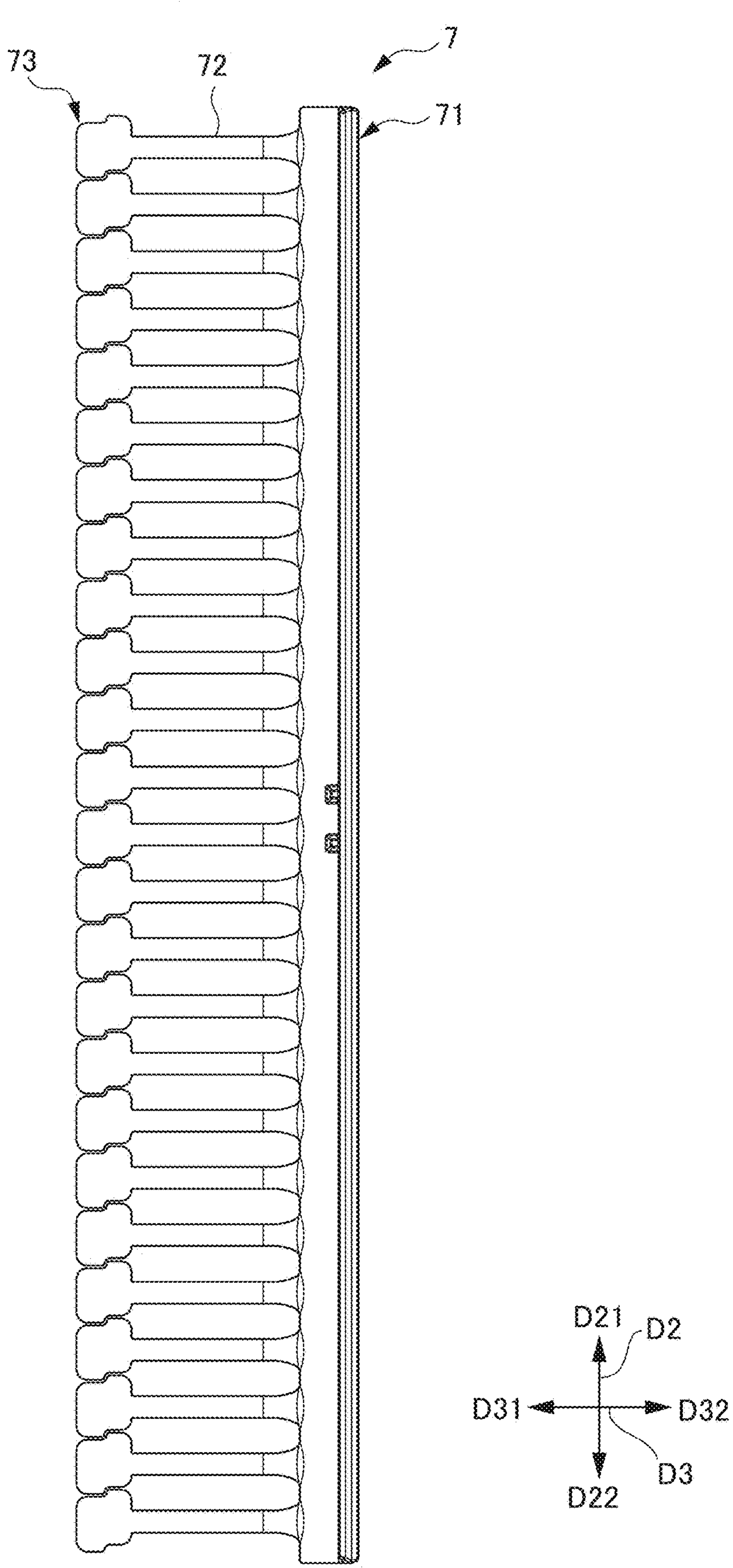
FIG. 5 is a front view illustrating the front retainer of the substrate storing container according to the embodiment of the present invention.
Figure 6:
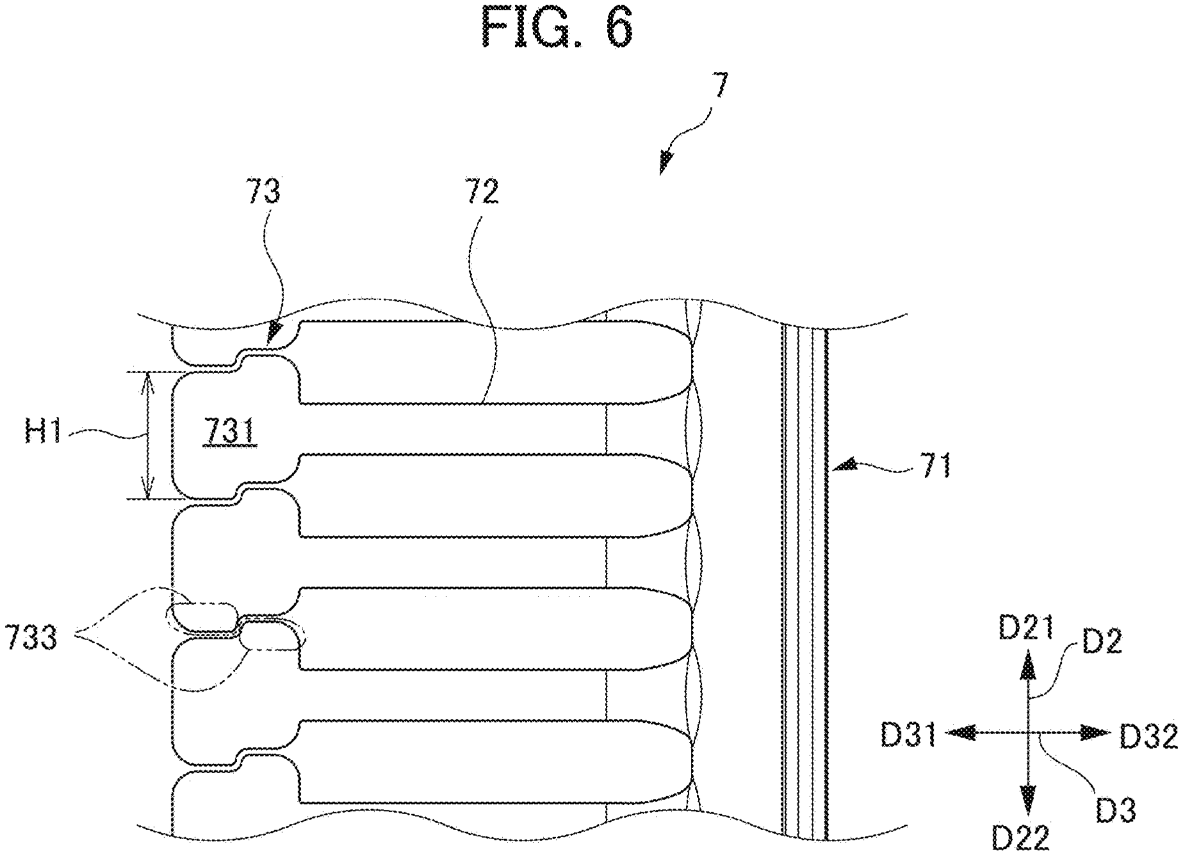
FIG. 6 is an enlarged front view illustrating the front retainer of the substrate storing container according to the embodiment of the present invention.
Figure 7:
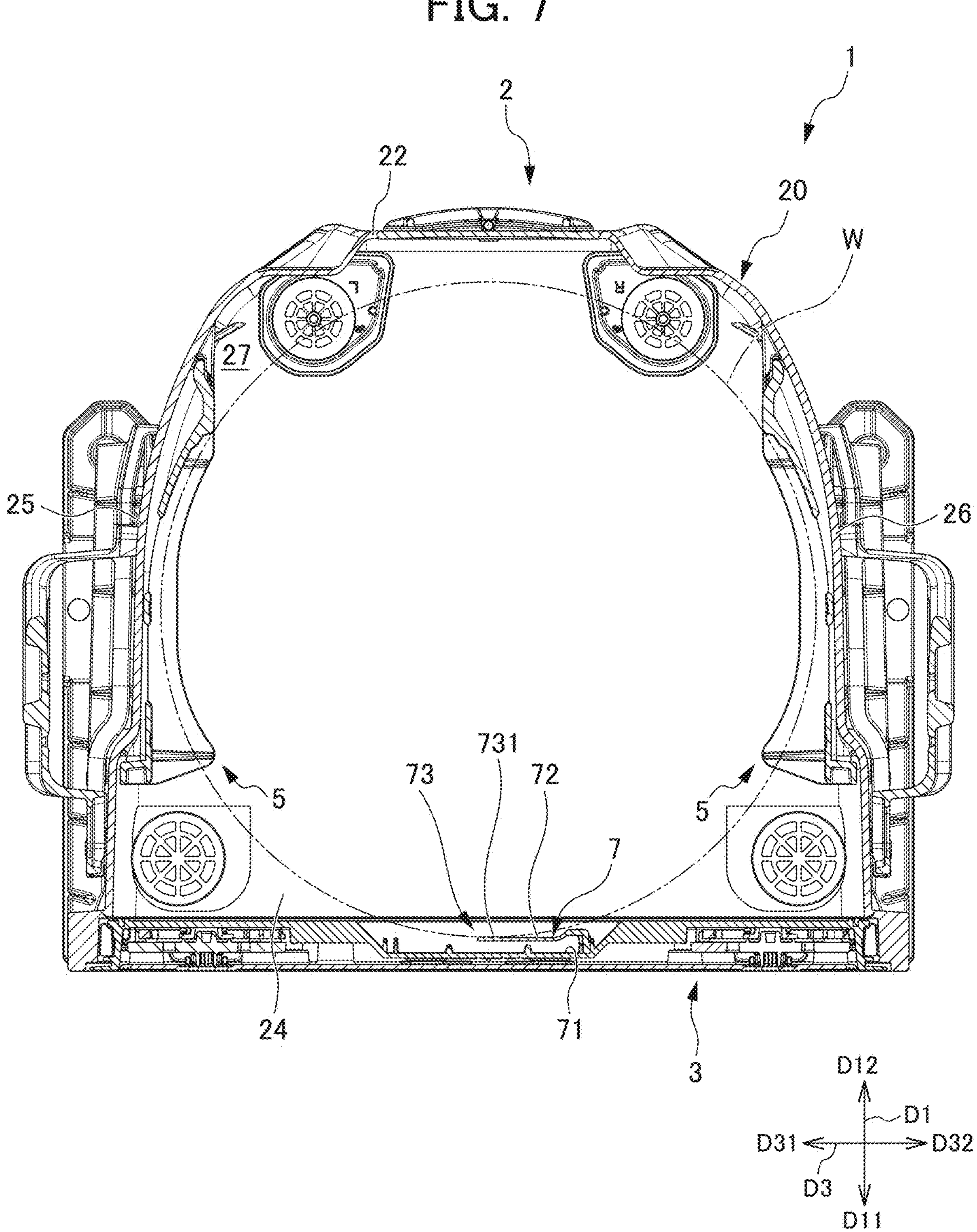
FIG. 7 is a cross-sectional view illustrating a positional relationship between a substrate stored in the substrate storing container and the front retainer according to the embodiment of the present invention.

As illustrated in FIGS. 4 to 6, the front retainer 7 includes the lid body side substrate support portions 73, leg portions 72, and a vertical frame body 71. Twenty-five lid body side substrate support portions 73 are arranged in the upward/downward direction D2, and are supported by the elastically deformable leg portions 72 on a one-to-one basis. The leg portions 72 extend away from the lid body side substrate support portions 73 in the right direction D32. As illustrated in FIGS. 4 to 6, the vertical frame body 71 extending in the upward/downward direction D2 is formed integrally with the leg portions 72 at the ends of the leg portions 72. Thus, each lid body side substrate support portion 73 is located at a free end of a cantilever spring whose cantilever is constituted by the leg portion 72. When the substrates W are stored in the substrate storing space 27 and the lid body 3 is closed, the lid body side substrate support portions 73 sandwich and support the frontmost ends of the edge portions of the substrates W while urging the frontmost ends toward the center of the substrate storing space 27 with the help of the elastic force of the leg portions 72.

Each lid body side substrate support portion 73 has, on its rear side, a support flat surface 731 that contacts with one point on the peripheral surface of the edge portion of one of the plurality of substrates W to thereby support the one substrate W. A plurality of the support flat surfaces 731 are provided so as to correspond to the peripheral surfaces of the edge portions of the plurality of substrates W on a one-to-one basis, and are each constituted by a vertical plane. When the container main body opening portion 21 is closed by the lid body 3, the support flat surfaces 731 contact with the edge ends of the surfaces (upper surfaces) of the substrates W. When the container main body opening portion 21 is closed by the lid body 3, the lid body side substrate support portions 73 are elastically displaceable in a direction from the other end toward the one end of the container main body 2 (in the forward direction D11).

As illustrated in FIGS. 4 to 6, each lid body side substrate support portion 73 has a shape which is composed of one rectangular half that is connected to the leg portion 72 and the other rectangular half that is closer to the leading end and is shifted, at a central position in the left/right direction D3, in the downward direction D22 with respect to the rectangular half connected to the leg portion 72. Therefore, as illustrated in FIG. 6, a lower left end portion of the support flat surface 731 of one lid body side substrate support portion 73 and an upper right end portion of the support flat surface 731 of another lid body side substrate support portion 73 directly under the one lid body side substrate support portion 73 form overlap portions 733 that are adjacent to each other in the left/right direction D3, which is a direction parallel to the upper surfaces of the substrates W. Thus, since the support flat surfaces 731 have the overlap portions 733 adjacent to each other in the left/right direction D3, a gap between the support flat surfaces 731 adjacent to each other in the upward/downward direction D2 does not have a straight linear shape in the left/right direction D3, but a crank shape.

The support flat surface 731 of each lid body side substrate support portion 73 has an edge close to the free end, and the edge has a length H1 of 5 mm or greater and 9 mm or less in the direction in which the plurality of substrates W are arranged in parallel in the substrate storing space 27, i.e., the upward/downward direction D2. The support flat surface 731 has an area S1 of 50 $mm^2$ or greater and 71.5 $mm^2$ or less.

Since the length H1 of the edge of the support flat surface 731 of the lid body side substrate support portion 73 close to the free end is 5 mm or greater in the upward/downward direction D2, the area S1 that contacts with the peripheral surface of the edge portion of the substrate W is as large as 50 $mm^2$ or greater. Thus, even when the thin substrate W is bent, a force is less likely to be applied to the substrate W itself, thereby reducing the likelihood that the substrate W will be broken. As a result, it is possible to reduce the likelihood that the substrate W will be damaged. Furthermore, the length H1 of the edge of the support flat surface 731 of the lid body side substrate support portion 73 close to the free end is more preferably 7 mm or greater in the upward/downward direction D2, thereby further reducing the likelihood that the substrate W will be broken.

Since the length H1 of the edge of the support flat surface 731 of the lid body side substrate support portion 73 close to the free end is 9 mm or less in the upward/downward direction D2, the area that contacts with the peripheral surface of the edge portion of the substrate W is limited to 71.5 $mm^2$ at most, whereby the number of substrates W that can be stored in the substrate storing container 1 is not smaller than the number of substrates that can be stored in an ordinary substrate storing container. The length H1 of the edge of the support flat surface 731 of the lid body side substrate support portion 73 close to the free end is more preferably 8.4 mm or less in the upward/downward direction D2, whereby it is reliably ensured that the number of substrates that can be stored in the substrate storing container 1 is not smaller than the number of substrates that can be stored in an ordinary substrate storing container.

According to the substrate storing container 1 of the first embodiment having the above-described configuration, the following effects can be obtained. A lid body side substrate support portion 73 has support flat surfaces 731 respectively configured to contact with peripheral surfaces of edge portions of a plurality of substrates W so as to support the substrates W, and the support flat surfaces 731 that contact with the peripheral surfaces of the edge portions of adjacent ones of the plurality of substrates W have overlap portions 733 adjacent to each other in a direction parallel to upper surfaces of the substrates W. This feature makes it possible to provide a substrate storing container 1 capable of holding the substrates W without breakage of or damage to the substrates W in a case where the substrates W are bent due to its own weight or an impact.

A plurality of the support flat surfaces 731 are provided to correspond to the peripheral surfaces of the edge portions of the plurality of substrates W on a one-to-one basis. Due to this feature, one support flat surface 731 contacts with the peripheral surface of the edge portion of one substrates W, whereby one substrate W can be supported by one support flat surface 731.

Each support flat surface 731 is located at a free end of a cantilever spring. Due to this feature, a configuration in which each support flat surface 731 is supported by the cantilever spring can be achieved. As result, the support flat surfaces 731 can support the substrates W with an appropriate urging force.

Each support flat surface 731 has a length H1 of 5 mm or greater in a direction in which the plurality of substrates W are arranged in parallel. Due to this feature, an area that contacts with the peripheral surface of the edge portion of the substrate W is as large as 50 $mm^2$ or greater. Thus, since the support flat surface 731 having a large area can support the substrate W, even when the thin substrate W is bent, a force is less likely to be applied to the substrate W itself, thereby reducing the likelihood that the substrate W will be broken. As a result, it is possible to reduce the likelihood that the substrate W will be damaged.

The present invention is not limited to the embodiment described above, and can be modified within the technical scope described in the claims.

For example, the shapes of the container main body and the lid body are not limited to the shapes of the container main body 2 and the lid body 3 of the above embodiment. The number and dimensions of the substrates W that can be stored in the container main body are not limited to the number and dimensions of the substrates W that can be stored in the container main body 2. That is, the configurations of the lateral substrate support (substrate support plate-like portion 5), the lid body side substrate support portion 73, and the back side substrate support portions 6 are not limited to those of the above embodiment. Furthermore, in the above embodiment, the substrate W is a silicon wafer having a diameter of 300 mm, but this value is a non-limiting example.

EXPLANATION OF REFERENCE NUMERALS

1: Substrate storing container
2: Container main body
3: Lid body
5: Substrate support plate-like portion (lateral substrate support)

6: Back side substrate support portion
20: Wall portion
21: Container main body opening portion
27: Substrate storing space
28: Opening peripheral portion
73: Lid body side substrate support portion
731: Support flat surface
733: Overlap portion
H1: Length
W: substrate

The invention claimed is:

1. A substrate storing container comprising:

a container main body including a tubular wall portion that has one end at which a container main body opening portion is formed and an other end closed, the container main body having a substrate storing space defined by an inner surface of the tubular wall portion, the substrate storing space being capable of storing a plurality of substrates and communicating with the container main body opening portion;

a lid body detachably attachable to the container main body opening portion and capable of closing the container main body opening portion;

a lid body side substrate support portion disposed on a part of the lid body, the part facing the substrate storing space when the container main body opening portion is closed by the lid body, the lid body side substrate support portion being capable of supporting edge portions of the plurality of substrates when the container main body opening portion is closed by the lid body; and a back side substrate support portion disposed to form a counterpart to the lid body side substrate support portion in the substrate storing space and capable of supporting the edge portion of the plurality of substrates, the back side substrate support portion being configured to cooperate with the lid body side substrate support portion to support the plurality of substrates such that the edge portions of the plurality of substrates are arranged in parallel when the container main body opening portion is closed by the lid body, wherein the lid body side substrate support portion has support flat surfaces respectively configured to contact with peripheral surfaces of the edge portions of the plurality of substrates so as to support the substrates, the support flat surfaces adjacent to each other have a positional relationship of being parallel to each other, and the support flat surfaces that contact with the peripheral surfaces of the edge portions of adjacent ones of the plurality of substrates have respective central portions in an upward/downward direction that do not face each other in a direction parallel to upper surfaces of the substrates, and have, in at least one of an upper end portion thereof or a lower end portion thereof in the upward/downward direction, an overlap portion adjacent to another overlap portion in the direction parallel to the upper surfaces of the substrates;

wherein the support flat surfaces are provided to correspond to the peripheral surfaces of the edge portions of the plurality of substrates on a one-to-one basis;

wherein each support flat surface is located at a free end of a cantilever spring;

wherein the cantilever springs are oriented such that a direction from the base end toward the free end is identical among all the cantilever springs.

2. The substrate storing container according to claim 1, wherein each support flat surface contacts with one substrate of the plurality of substrates at one point on a peripheral surface of the edge portion of a front part of the one substrate.

3. The substrate storing container according to claim 2, wherein the substrate storing space stores the plurality of substrates arranged in parallel, and each support flat surface has a length of 5 mm or greater in a direction in which the plurality of substrates are arranged in parallel.

4. The substrate storing container according to claim 2, wherein each support flat surface has an area of 50 $mm^2$ or greater.

5. A lid body side substrate support portion for a substrate storing container that includes:

a container main body including a tubular wall portion that has one end at which a container main body opening portion is formed and an other end closed, the container main body having a substrate storing space defined by an inner surface of the tubular wall portion, the substrate storing space being capable of storing a plurality of substrates and communicating with the container main body opening portion;

a lid body detachably attachable to the container main body opening portion and capable of closing the container main body opening portion;

the lid body side substrate support portion disposed on a part of the lid body, the part facing the substrate storing space when the container main body opening portion is closed by the lid body, the lid body side substrate support portion being capable of supporting edge portions of the plurality of substrates when the container main body opening portion is closed by the lid body; and a back side substrate support portion disposed to form a counterpart to the lid body side substrate support portion in the substrate storing space and capable of supporting the edge portion of the plurality of substrates, the back side substrate support portion being configured to cooperate with the lid body side substrate support portion to support the plurality of substrates such that the edge portions of the plurality of substrates are arranged in parallel when the container main body opening portion is closed by the lid body, the lid body side substrate support portion comprising:

support flat surfaces configured to respectively contact with peripheral surfaces of the edge portions of the plurality of substrates so as to support the substrates, wherein the support flat surfaces adjacent to each other have a positional relationship of being parallel to each other, and the support flat surfaces that contact with the peripheral surfaces of the edge portions of adjacent ones of the plurality of substrates have respective central portions in an upward/downward direction that do not face each other in a direction parallel to upper surfaces of the substrates, and have, in at least one of an upper end portion thereof or a lower end portion thereof in the upward/downward direction, an overlap portion adjacent to another overlap portion in the direction parallel to the upper surfaces of the substrates;

wherein the support flat surfaces are provided to correspond to the peripheral surfaces of the edge portions of the plurality of substrates on a one-to-one basis;

wherein each support flat surface is located at a free end of a cantilever spring; and the cantilever springs are oriented such that a direction from the base end toward the free end is identical among all the cantilever springs.

6. The lid body side substrate support portion according to claim 5, wherein each support flat surface contacts with one substrate of the plurality of substrates at one point on a peripheral surface of the edge portion of a front part of the one substrate.

7. The lid body side substrate support portion according to claim 6, wherein the substrate storing space stores the plurality of substrates arranged in parallel, and each support flat surface has a length of 5 mm or greater in a direction in which the plurality of substrates are arranged in parallel.

8. The lid body side substrate support portion according to claim 6, wherein each support flat surface has an area of 50 $mm^2$ or greater.

* * * * *